(12) United States Patent
Napolitano

(10) Patent No.: US 6,475,898 B2
(45) Date of Patent: Nov. 5, 2002

(54) METHOD OF FORMING INTERCONNECTINGS IN SEMICONDUCTOR DEVICES

(75) Inventor: Mario Napolitano, Vimercate (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 10/014,921

(22) Filed: Dec. 11, 2001

(65) Prior Publication Data

US 2002/0090810 A1 Jul. 11, 2002

(30) Foreign Application Priority Data

Dec. 12, 2000 (EP) .......................... 00830810.8

(51) Int. Cl.[7] .......................... H01L 21/4763
(52) U.S. Cl. .................. 438/619; 438/624; 438/625; 438/627; 438/634; 438/637; 438/643; 438/666; 438/667; 438/672; 438/675; 438/687
(58) Field of Search ................. 438/619, 624, 438/625, 627, 634, 637, 643, 666, 667, 672, 675, 687

(56) References Cited

U.S. PATENT DOCUMENTS

| 4,624,749 | A |   | 11/1986 | Black et al. | 204/15 |
| 5,145,571 | A |   | 9/1992 | Lane et al. | 205/123 |
| 5,461,003 | A | * | 10/1995 | Havenmann et al. | 438/666 |
| 6,020,261 | A |   | 2/2000 | Weisman | 438/669 |
| 6,146,985 | A | * | 11/2000 | Wollesen | 438/619 |
| 6,187,672 | B1 | * | 2/2001 | Zhao et al. | 438/622 |
| 6,218,282 | B1 | * | 6/2001 | Huynoski | 438/619 |
| 6,245,658 | B1 | * | 6/2001 | Huynoski | 438/619 |
| 6,251,789 | B1 | * | 6/2001 | Wilson et al. | 438/687 |
| 6,309,956 | B1 | * | 10/2001 | Chiang et al. | 438/624 |

FOREIGN PATENT DOCUMENTS

DE 19716044 10/1998 ............ H03K/3/22

* cited by examiner

Primary Examiner—Richard Booth
Assistant Examiner—Lynne Gurley
(74) Attorney, Agent, or Firm—Lisa K. Jorgenson; Allen, Dyer, Doppelt, Milbrath & Gilchrist, P.A.

(57) ABSTRACT

A method for forming an conductive interconnection in an electronic semiconductor device includes forming a layer of insulating material on a substrate of semiconductor material having a contact region therein, and forming a first opening through the layer of insulating material to expose the contact region. The first opening is filled with a material to form a first connection element. A first layer comprising a first removable conductive material is formed adjacent the layer of insulating material and the first connection element. The method further includes forming a second opening in the first layer to expose the first connection element, and filling the second opening with the material to form a second connection element. The first removable conductive material is removed except for a portion underlying the second connection element to expose the layer of insulating material. The areas left free after removing the first removable conductive material are filled with a dielectric material.

30 Claims, 2 Drawing Sheets

METHOD OF FORMING INTERCONNECTINGS IN SEMICONDUCTOR DEVICES

FIELD OF THE INVENTION

The present invention relates to electronic semiconductor devices having electrical interconnection structures on a substrate and, more particularly, to a method of forming these interconnection structures.

BACKGROUND OF THE INVENTION

The continued tendency to reduce the geometry and to increase the speed of operation of integrated circuits requires the use of conductors with high conductivity to reduce the cross-sections of the conductive tracks, and the use of dielectrics with low dielectric constants to improve the insulation between adjacent conductive tracks. The most usual method of forming interconnections up to now provides for the formation of a dielectric layer having openings for contact with an underlying layer, the deposition of a layer of metal, typically aluminum, on the dielectric layer, and selective etching of the metal layer by photolithographic techniques to form the necessary interconnection elements.

This method has various disadvantages. These disadvantages include a poor ability to cover stepped structures so that the conductive tracks tend to become thinner on the walls of the openings, poor dimensional control when interconnection elements are defined by wet chemical etching, and other problems with dry etching when the nature of the metal permits it. Aluminium can easily be etched dry but copper or gold cannot. Moreover, with this method, to produce a dielectric layer for covering the interconnection elements, which has a flat surface, it is necessary to use planarizing techniques, for example, chemical-mechanical polishing (CMP), which further complicates the production process and may introduce defects and contamination.

Various alternative methods have been proposed for overcoming the limitations of this known technique. Among these are the known methods which provide for the formation of interconnection elements in a dielectric layer by the hollowing-out of thin channels, the filling of the channels with a metal and the planarization of the surface. This technique is similar to the old technique for decorating metal surfaces known by the name of "damascene" and is defined by the same name in this application to the technology of semiconductor devices.

The single damascene technique produces conductive openings or vias through a dielectric layer while maintaining optimal planarity. By applying the same technique twice (a double damascene technique), it is possible to produce complete interconnections formed by conductive vias through a dielectric layer and interconnection elements formed on the dielectric layer.

With this technique, it is possible to use metals such as copper, which have better conductivity than aluminium. Copper is used predominantly for interconnections according to the conventional technique. Interconnection tracks of smaller cross-section can therefore be produced. However, this technique uses conventional dielectrics and does not permit the production of devices with improved performance with regard to the insulation of the conductive tracks from the semiconductor substrate, or of the tracks from one another.

SUMMARY OF THE INVENTION

In view of the foregoing background, an object of the present invention is to provide a method of forming semiconductor devices with high-conductivity interconnections and with insulators having low dielectric constants.

BRIEF DESCRIPTION OF THE DRAWINGS

The invention and the advantages resulting therefrom will be understood further from the following detailed description of an embodiment of the invention, given by way of a non-limiting example with reference to the appended drawings, in which.

DETAILED DESCRIPTION OF THE PREFERRED EMBODIMENTS

Figure 1:
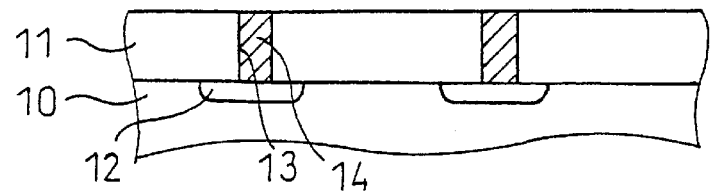
FIGS. 1 to 10 show, in cross section, a portion of a semiconductor device in various stages of its processing by a method according to the invention.

A substrate 10 of semiconductor material, for example, monocrystalline silicon, is treated by the usual processes for the manufacture of integrated circuits to produce a plurality of components. Some of which are already interconnected and some of which are to be connected to one another or to external terminals. FIG. 1 shows two diffused regions 12 having respective areas to be contacted on the substrate surface.

To produce the structure shown in FIG. 1, a layer of insulating material, for example, silicon dioxide, is formed on the substrate 10. Openings are formed in the insulating layer, for example, by reactive ion etching (RIE) through a photoresist mask (not shown). A metal, for example, tungsten, is applied to the insulating layer and in the openings, for example, by chemical vapor deposition (CVD). The metal is then removed from the surface of the insulating layer, for example, by a chemical-mechanical polishing (CMP) process, to produce an insulating layer 11, for example, 300–2000 nm thick, with a flat surface and with openings 13 filled by conductive connection elements or plugs 14. As is known to persons skilled in the art, if tungsten is used, before its deposition, a barrier layer (not shown) composed of titanium and of titanium nitride, 50–100 nm thick, is formed on the walls and on the base of the openings 13.

Figure 2:
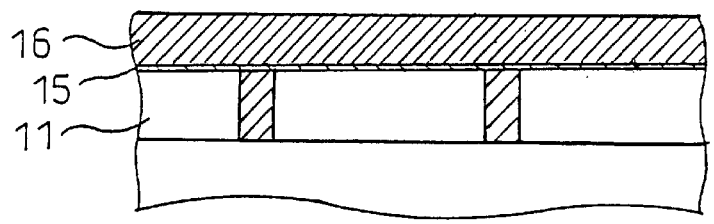

A thin layer 15 (for example 100 nm) of a conductive material, which will be called the barrier layer and the functions of which will be explained below, is then formed (FIG. 2). In this embodiment, the layer 15 is titanium nitride (TiN) produced by chemical vapor deposition (CVD).

A layer 16 of a conductive material is deposited on the barrier layer 15. The main characteristic of this layer is that it can be removed completely in a final step of the method. This material preferably has the following properties. It has a conductivity of 50 S/cm or more, and can be deposited in a uniform film. The material also has good adhesion to the materials with which it is in contact, and can be removed completely by chemicals or by plasma etching. A material with these properties is polyaniline treated so as to be conductive. Polyaniline is a polymer which can easily be applied in a uniform layer by the usual method for the deposition of a material in the liquid state on a spinning substrate and subsequent drying. Another usable material is graphite, which is preferably applied by cathodic sputtering. The thickness of the layer 16 is elected to be equal to that of the interconnection elements 18 (FIG. 4), which are to be formed by the subsequent steps.

Figure 3:
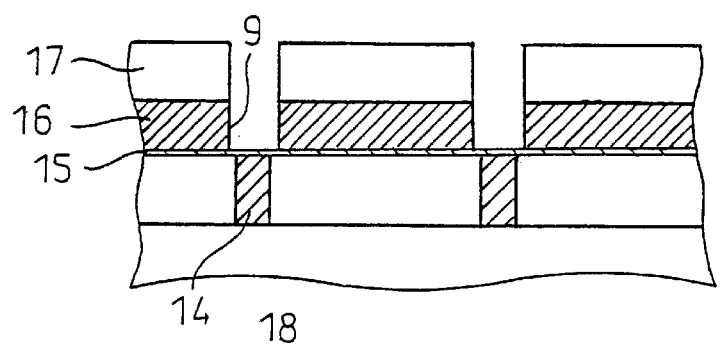

A photoresist layer 17 is deposited and is treated to form a mask which leaves the areas above the tungsten plugs 14 exposed. The exposed conductive layer 16 is removed, for example, by anisotropic plasma etching, if it is polyaniline, to form openings 9 which expose the barrier layer 15, as shown in FIG. 3.

Figure 4:
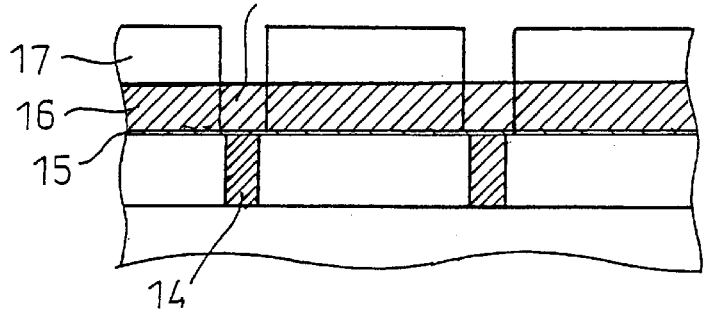

With the photoresist layer 17 kept in position, interconnection elements 18 (FIG. 4) are formed by the electrochemical deposition of a metal having good conductivity, for example, copper. The process is made possible by the fact that the conductive layers 15 and 16 allow current to flow from the edges of the substrate to the tops of the tungsten plugs 14. In FIG. 4, the copper interconnection elements 18 are shown with exactly the same thickness as the conductive layer 16. This alignment is advisable, but some positive or negative nonalignment can be tolerated. The duration of the electrochemical deposition process is therefore not critical. In addition to its function as an electrical conductor, which was explained above, the layer 15 also has the function of preventing copper atoms from diffusing into the insulating layer 11, which is preferably silicon dioxide, or into the insulating material which will be formed during the subsequent steps of the method.

For very narrow openings 9, more precisely, openings having a high height/width ratio (a high aspect ratio) it may be advantageous to limit the growth of the metal to growth purely from the bases of the openings 9. This can be achieved by rendering the layer 16 non-conductive in the vicinity of the walls of the openings 9. If polyaniline is used, this is possible with a bath of an alkaline liquid, for example, ammonia in aqueous solution ($NH_4OH$).

The method continues with the deposition of a second layer 19 (FIG. 5) of removable conductive material, for example, treated polyaniline again, by the opening, in the second layer 19, (FIG. 6) through channels 20 above the elements 18 to be connected to one another, and/or of vias for connection to external terminals, and by the filling of these channels and/or vias with a second electrochemical deposition of metal, for example, copper again (FIG. 7), to form interconnection tracks and/or vias 21.

Figure 8:
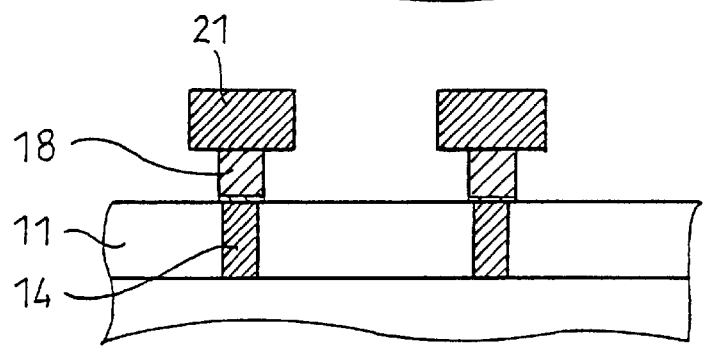

If a single level suffices for the interconnection tracks, the conductive material of the layers 15, 16 and 19 is removed so as to insulate all of the interconnection tracks and vias from one another as shown in FIG. 8. If polyaniline is used, the layers 16 and 19 can be removed by chemicals with the usual photoresist-removal baths, or by isotropic etching in oxygen plasma. The layer 15 (TiN) can be removed by isotropic etching in plasma, which may possibly be the same as used to remove the layers 16 and 19. Naturally, the portions of the layer 15 which are disposed between the connection elements 18 and the tungsten plugs 14 are not removed by the isotropic etching, except to a negligible extent at the edges.

A layer 22 of a dielectric material with a low dielectric constant is then formed and fills all of the spaces between the insulating layer 11 and the interconnection elements 18, 21. In this embodiment, an aerogel is used, that is, a porous siliceous material the pores of which have diameters of a few nanometer and which has a very low dielectric constant, typically less than half of that of dense silica. The aerogel layer 22 is formed with the use of materials and techniques known to persons skilled in the art, for example, as described in Chapter V of the Enichem publication of Nov. 11, 1991, by Cerofolini, Mininni and Schwarz, entitled "Chemistry For Innovative Materials".

Figure 10:
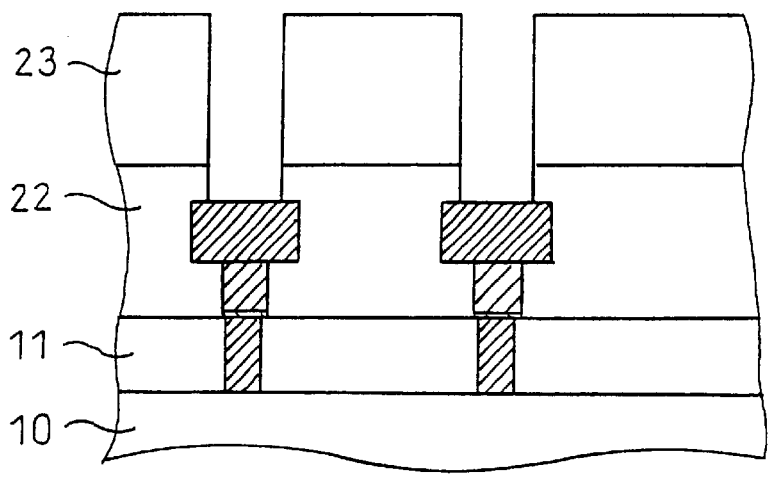

The usual steps then follow for final passivation by the deposition of a layer 23 of silicon dioxide, for the opening of the contact areas (FIG. 10), and for the formation of the metal terminals (not shown) of the device.

Figure 5:
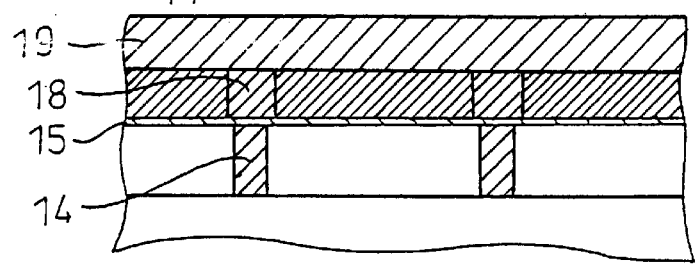
Figure 6:
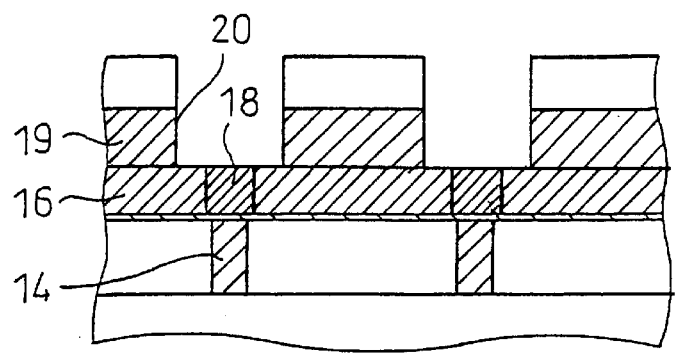
Figure 7:
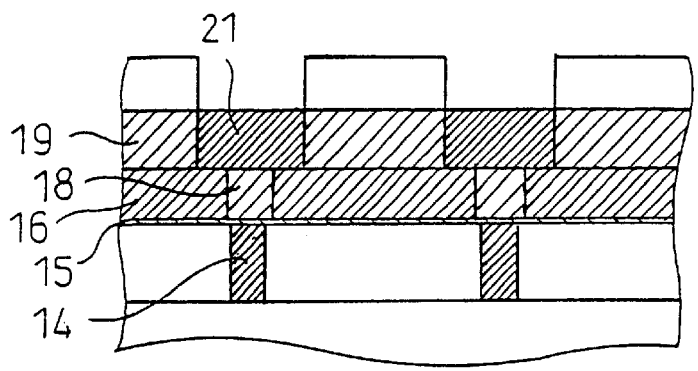

With the method described above, an interconnection structure with a so-called single metallization level is produced. If an interconnection structure with several levels is to be produced, some of the steps described above, that is, substantially those described with reference to FIGS. 5 to 7, are repeated. More particularly, after the formation of the first level, that is, of the connection elements 21 (FIG. 7), a further layer of removable conductive material, for example, treated polyaniline again, is formed.

Figure 9:
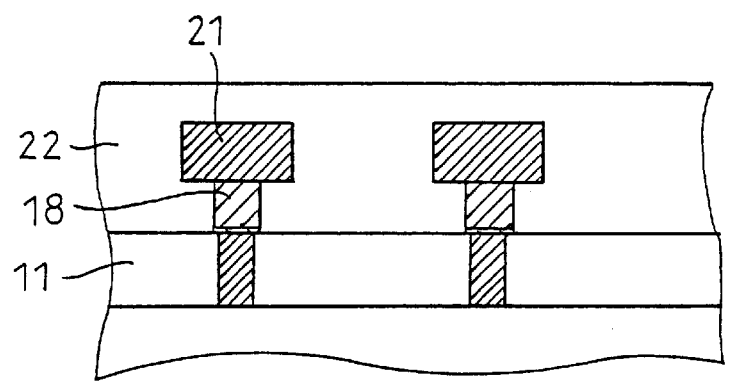

Through-channels are opened in the further layer, above the elements 21 to be connected to one another, and vias are opened for connection to external terminals. These channels and vias are then filled by a further electrochemical deposition of metal, for example, copper again, to form tracks of a second metallization level and vias for interconnection with the first level. The same series of steps is repeated a number of times equal to the number of metallization levels required. After the formation of the connections of the last metallization level, the method continues with the steps described with reference to FIGS. 8 to 10.

As should be clear from the foregoing, none of the steps of the method according to the invention will alter the planarity of the structure being processed so that planarizing treatments are not required. Moreover, the use of removable conductive material instead of the usual dielectric material for separating the conductive layers has two advantageous effects. It allows high-conductivity connection elements to be formed by electrochemical means and it enables a material with a low dielectric constant, formed by a single operation in the last stages of the method, to be used as the insulating material between the various metallization levels. With the method of the invention, the final manufacturing output is higher than that which can be achieved with known methods because the damage which results from the planarizing treatments and the damage to the insulating layers resulting from the repeated treatments, including plasma etching, are entirely avoided.

Although only one embodiment of the present invention has been described and illustrated, clearly many variations are possible within the scope of the same inventive concept. For example, in order to form the connection elements 18 and 21, any other metal which can be deposited by an electrochemical process may be used instead of copper. The material of the barrier layer 15 may also be other than titanium nitride. For example, if platinum is used, it may be titanium oxide.

What is claimed is:

1. A method for forming at least one conductive interconnection in an electronic semiconductor device comprising:

forming a layer of insulating material on a substrate of semiconductor material having at least one contact region therein;

forming at least one first opening through the layer of insulating material to expose the at least one contact region;

filling the at least one first opening with a material to form at least one first connection element;

forming a barrier layer comprising a first removable conductive material on the layer of insulating material and on the at least one first connection element;

forming a first layer comprising a second removable conductive material on the barrier layer;

forming at least one second opening in the first layer to expose the barrier layer above the at least one first connection element, filling the at least one second opening with the material to form at least one second connection element;

forming a second layer comprising a third removable conductive material on the first layer;

forming at least one third opening in the second layer to expose the at least one second connection element;

filling the at least one third opening with the material to form at least one third connection element;

removing the second and third removable conductive materials, and removing the first removable conductive material except for a portion underlying the at least one second connection element to expose the layer of insulating material; and filling with dielectric material areas left free after removing the first, second and third removable conductive materials.

2. A method according to claim 1, wherein the material for filling the first, second and third openings comprises copper.

3. A method according to claim 1, wherein filling the at least one second and third openings with the material is performed by electrochemical deposition.

4. A method according to claim 1, further comprising:

forming a third layer comprising a fourth removable conductive material on the second layer and on the at least one third connection element;

forming at least one fourth opening in the third layer to expose the at least one third connection element; and filling the at least one fourth opening with the material to form at least one fourth connection element.

5. A method according to claim 4, further comprising repeating the forming and filling steps for forming additional connection elements.

6. A method according to claim 4, wherein filling the at least one fourth opening with the material is performed by electrochemical deposition.

7. A method according to claim 1, further comprising making non-conductive walls of the at least one second and third openings.

8. A method according to claim 4, further comprising making non-conductive walls of the at least one fourth opening.

9. A method according to claim 1, wherein the first, second and third removable conductive materials each comprises a conductive polymer.

10. A method according to claim 9, wherein the conductive polymer comprises polyaniline.

11. A method according to claim 4, wherein the fourth removable conductive material comprises a conductive polymer.

12. A method according to claim 11, wherein the conductive polymer comprises polyaniline.

13. A method according to claim 1, wherein the dielectric material comprises aerogel.

14. A method for forming at least one conductive interconnection in an electronic semiconductor device comprising:

forming a layer of insulating material on a substrate of semiconductor material having at least one contact region therein;

forming at least one first opening through the layer of insulating material to expose the at least one contact region;

filling the at least one first opening with a material to form at least one first connection element;

forming a first layer comprising a first removable conductive material adjacent the layer of insulating material and adjacent the at least one first connection element;

forming at least one second opening in the first layer to expose the at least one first connection element;

filling the at least one second opening with the material to form at least one second connection element;

removing the first removable conductive material except for a portion underlying the at least one second connection element to expose the layer of insulating material; and filling with dielectric material areas left free after removing the first removable conductive material.

15. A method according to claim 14, further forming a second layer comprising a second removable conductive material on the first layer;

forming at least one third opening in the second layer to expose the at least one second connection element;

filling the at least one third opening with the material to form at least one third connection element; and wherein removing the first removable conductive material further comprises removing the second removable conductive material; and wherein filling further comprises filling the dielectric material in an area left free after removing the second removable conductive material.

16. A method according to claim 14, wherein the material for filling the first and second openings comprises copper.

17. A method according to claim 14, further comprising forming a barrier layer comprising a third removable conductive material between the layer of insulating material and the first layer.

18. A method according to claim 14, wherein filling the at least one second opening with the conductive material is performed by electrochemical deposition.

19. A method according to claim 14, further comprising making non-conductive walls of the at least one second opening.

20. A method according to claim 14, wherein the first removable conductive material comprises a conductive polymer.

21. A method according to claim 20, wherein the conductive polymer comprises polyaniline.

22. A method according to claim 14, wherein the dielectric material comprises aerogel.

23. A method for forming at least one conductive interconnection in an electronic semiconductor device comprising a substrate of semiconductor material having at least one contact region therein, the method comprising:

forming a layer of insulating material on the substrate;

forming at least one first opening through the layer of insulating material to expose the at least one contact region;

filling the at least one first opening with a material to form at least one first connection element;

forming a barrier layer comprising a first removable conductive material on the layer of insulating material and on the at least one first connection element;

forming a first layer comprising a second removable conductive material on the barrier layer;

forming at least one second opening in the first layer to expose the barrier layer above the at least one first connection element;

filling the at least one second opening with the material to form at least one second connection element;

removing the second removable conductive material and removing the first removable conductive material except for a portion underlying the at least one second connection element to expose the layer of insulating material; and filling with dielectric material areas left free after removing the first and second removable conductive materials.

24. A method according to claim 23, further comprising:

forming a second layer comprising a third removable conductive material on the first layer;

forming at least one third opening in the second layer to expose the at least one second connection element;

filling the at least one third opening with the material to form at least one third connection element; and wherein removing the first and second removable conductive materials further comprises removing the third removable conductive material; and wherein filling further comprises filling the dielectric material in an area left free after removing the third removable conductive material.

25. A method according to claim 24, wherein the material for filling the first, second and third openings comprises copper.

26. A method according to claim 23, wherein filling the at least one second opening with the conductive material is performed by electrochemical deposition.

27. A method according to claim 23, further comprising making non-conductive walls of the at least one second opening.

28. A method according to claim 23, wherein the first and second removable conductive materials each comprises a conductive polymer.

29. A method according to claim 28, wherein the conductive polymer comprises polyaniline.

30. A method according to claim 23, wherein the dielectric material comprises aerogel.

* * * * *

UNITED STATES PATENT AND TRADEMARK OFFICE
CERTIFICATE OF CORRECTION

PATENT NO. : 6,475,898 B2
DATED : November 5, 2002
INVENTOR(S) : Mario Napolitano It is certified that error appears in the above-identified patent and that said Letters Patent is hereby corrected as shown below:

Title page, Item [54] and Column 1, line 2,
Delete: "INTERCONNECTINGS' insert -- INTERCONNECTIONS --

Title page,
Item [30], delete: "Dec. 12, 2000" insert -- Dec. 11, 2000 --

Column 2,
Line 3,

Insert -- This and other objects, advantages and features according to the present invention are provided by a method for forming at least one conductive interconnection in an electronic semiconductor device, with the method comprising forming a layer of insulating material on a substrate of semiconductor material having at least one contact region therein, forming at least one first opening through the layer of insulating material to expose the at least one contact region, and filling the at least one first opening with a material to form at least one first connection element.
   The method further includes forming a first layer comprising a first removable conductive material adjacent the layer of insulating material and adjacent the at least one first connection element, forming at least one second opening in the first layer to expose the at least one first connection element, and filling the at least one second opening with the material to form at least one second connection element. The first removable conductive material is removed except for a portion underlying the at least one second connection element to expose the layer of insulating material. The area left free after removing the first removable conductive material is filled with a dielectric material.

UNITED STATES PATENT AND TRADEMARK OFFICE
CERTIFICATE OF CORRECTION

PATENT NO. : 6,475,898 B2
DATED : November 5, 2002
INVENTOR(S) : Mario Napolitano It is certified that error appears in the above-identified patent and that said Letters Patent is hereby corrected as shown below:

Column 2,
Line 3 cont'd,    The method may further include forming a barrier layer comprising a third removable conductive material between the layer of insulating material and the first layer. The method may also further comprise forming a second layer comprising a second removable conductive material on the first layer, forming at least one third opening in the second layer to expose the at least one second connection element, and filling the at least one third opening with the material to form at least one third connection element. The removing further comprises removing the second removable conductive material, and the filling further comprises filling the dielectric material in an area left free after removing the second removable conductive material.
    Filling the at least one second opening with the conductive material is preferably performed by electrochemical deposition. The method preferably further comprises making non-conductive walls of the at least one second opening. The first removable conductive material may be a conductive polymer, such as polyaniline. The dielectric material may be aerogel, and the material for filling the first and second openings may be copper. --

Signed and Sealed this

Twenty-second Day of July, 2003

JAMES E. ROGAN
*Director of the United States Patent and Trademark Office*